US009960247B2

(12) United States Patent
Li et al.

(10) Patent No.: US 9,960,247 B2
(45) Date of Patent: May 1, 2018

(54) SCHOTTKY BARRIER STRUCTURE FOR SILICON CARBIDE (SIC) POWER DEVICES

(71) Applicants: Ruigang Li, Fremont, CA (US); Zheng Zuo, Culver City, CA (US); Bochao Huang, Chino, CA (US); Da Teng, Culver City, CA (US)

(72) Inventors: Ruigang Li, Fremont, CA (US); Zheng Zuo, Culver City, CA (US); Bochao Huang, Chino, CA (US); Da Teng, Culver City, CA (US)

( * ) Notice: Subject to any disclaimer, the term of this patent is extended or adjusted under 35 U.S.C. 154(b) by 0 days. days.

(21) Appl. No.: 15/410,695

(22) Filed: Jan. 19, 2017

(65) Prior Publication Data
US 2017/0207318 A1 Jul. 20, 2017

Related U.S. Application Data
(60) Provisional application No. 62/280,225, filed on Jan. 19, 2016.

(51) Int. Cl.
H01L 29/872 (2006.01)
H01L 29/47 (2006.01)
H01L 21/329 (2006.01)
H01L 29/66 (2006.01)
H01L 29/16 (2006.01)
H01L 21/02 (2006.01)
(Continued)

(52) U.S. Cl.
CPC .... H01L 29/6606 (2013.01); H01L 21/02529 (2013.01); H01L 21/0495 (2013.01); H01L 21/28537 (2013.01); H01L 29/1608 (2013.01); H01L 29/47 (2013.01); H01L 29/66143 (2013.01); H01L 29/872 (2013.01); H01L 2924/12032 (2013.01)

(58) Field of Classification Search
CPC ........... H01L 29/66143; H01L 29/0619; H01L 29/1608; H01L 29/872; H01L 2924/12032; H01L 21/02529; H01L 21/02447; H01L 21/28537; H01L 29/6606; H01L 29/47; H01L 21/0495
See application file for complete search history.

(56) References Cited

U.S. PATENT DOCUMENTS 5,371,400 A * 12/1994 Sakurai ................. H01L 29/872
257/478
5,789,311 A * 8/1998 Ueno ................... H01L 29/1608
257/E21.067

(Continued)

Primary Examiner — Marvin Payen
Assistant Examiner — Jeremy Joy
(74) Attorney, Agent, or Firm — Che-Yang Chen; Law Offices of Scott Warmuth

(57) ABSTRACT

A method for fabricating a silicon carbide power device may include steps of: forming a first n-type silicon carbide layer on top of a second n-type silicon carbide layer; depositing a first metal layer on the first silicon carbide layer; patterning the first metal layer; depositing and patterning a dielectric layer onto at least a portion of the pattered first metal layer; and depositing and patterning a second metal layer to form a Schottky barrier. In one embodiment, the first metal layer is a high work function metal layer, which may include Silver, Aluminum, Chromium, Nickel and Gold. In another embodiment, the second metal layer is called a "Schottky metal" layer, which may include Platinum, Titanium and Nickel Silicide.

7 Claims, 6 Drawing Sheets

(51) Int. Cl.
*H01L 21/285* (2006.01)
*H01L 21/04* (2006.01)

(56) References Cited

U.S. PATENT DOCUMENTS

| | | | | |
|---|---|---|---|---|
| 5,914,500 A * | 6/1999 | Bakowski | ........... | H01L 29/0615 257/472 |
| 6,673,662 B2 * | 1/2004 | Singh | ........... | H01L 29/868 257/E29.104 |
| 7,274,083 B1 * | 9/2007 | Sankin | ........... | H01L 29/868 257/471 |
| 8,895,424 B2 * | 11/2014 | Carta | ........... | H01L 29/47 438/581 |
| 2001/0054715 A1 * | 12/2001 | Collard | ........... | H01L 29/66143 257/77 |
| 2003/0045035 A1 * | 3/2003 | Shenai | ........... | H01L 29/6606 438/142 |
| 2003/0162355 A1 * | 8/2003 | Sankin | ........... | H01L 29/0619 438/268 |
| 2008/0029838 A1 * | 2/2008 | Zhang | ........... | H01L 21/046 257/475 |
| 2010/0207166 A1 * | 8/2010 | Zhu | ........... | H01L 29/08 257/201 |
| 2010/0289109 A1 * | 11/2010 | Henning | ........... | H01L 21/0495 257/486 |
| 2012/0080687 A1 * | 4/2012 | Kuraguchi | ........... | H01L 29/205 257/76 |
| 2012/0218796 A1 * | 8/2012 | Okamoto | ........... | H01L 29/0615 363/126 |
| 2013/0032809 A1 * | 2/2013 | Allen | ........... | H01L 29/47 257/73 |
| 2013/0087835 A1 * | 4/2013 | Edwards | ........... | H01L 29/66143 257/263 |
| 2013/0119394 A1 * | 5/2013 | Zhu | ........... | H01L 29/872 257/76 |
| 2013/0126884 A1 * | 5/2013 | Romano | ........... | H01L 29/66212 257/76 |
| 2013/0181319 A1 * | 7/2013 | Huang | ........... | H01L 29/872 257/471 |
| 2013/0270571 A1 * | 10/2013 | Huang | ........... | H01L 29/475 257/76 |
| 2014/0145289 A1 * | 5/2014 | Zhang | ........... | H01L 29/475 |
| 2015/0194313 A1 * | 7/2015 | Ryo | ........... | H01L 29/6606 438/478 |
| 2015/0295096 A1 * | 10/2015 | Oka | ........... | H01L 29/872 257/76 |
| 2016/0276442 A1 * | 9/2016 | Oota | ........... | H01L 29/1608 |

* cited by examiner

SCHOTTKY BARRIER STRUCTURE FOR SILICON CARBIDE (SIC) POWER DEVICES

CROSS-REFERENCE TO RELATED APPLICATIONS

This application claims priority under 35 U.S.C. § 119 (e) to U.S. Provisional Patent Application Ser. No. 62/280,225, filed on Jan. 19, 2016, the entire contents of which are hereby incorporated by reference.

FIELD OF THE INVENTION

The present invention relates to semiconductor devices, and more particularly to a Schottky diode formed on a silicon carbide (SiC) substrate.

BACKGROUND OF THE INVENTION

In recent years, in order to achieve high breakdown voltage, low loss, and the like in a semiconductor device, silicon carbide has begun to be adopted as a material for the semiconductor device. Silicon carbide has a wide energy bandgap, high melting point, low dielectric constant, high breakdown-field strength, high thermal conductivity, and high saturation electron drift velocity compared to silicon. These characteristics would allow silicon carbide power devices to operate at higher temperatures, higher power levels, and with lower specific on-resistance than conventional silicon based power devices. Such devices must also exhibit low reverse leakage currents. Large reverse leakage currents cause premature soft breakdown.

For power applications, silicon carbide's wide bandgap results in a high impact ionization energy. In turn, this allows SiC to experience relatively high electric fields without avalanche multiplication of ionized carriers. By way of comparison, silicon carbide's electric field capacity is about ten times as great as that of silicon.

It has been known that in Schottky diodes the metal semiconductor interface between the Schottky barrier metal and the semiconductor plays a crucial role in the electrical performance of electronic devices. Many factors can worsen the performance of the interface in a Schottky diode. Also, an anneal for diffusion of an implantation of a P-type dopant would require the temperature on the order of 1500 to 2000° C., which raises acute technological problems and the costs of the equipment can be very high.

The elementary structure of a Schottky diode is illustrated in FIG. 1. This diode is formed from a heavily-doped N-type substrate 1 that is formed on an N-type epitaxial layer 2 properly doped to have the desired Schottky threshold. On this epitaxial layer N is deposited silicon oxide/or other dielectrics 3 defining a window in which the Schottky contact is desired to be established by means of an adequate metallization 4. The rear surface of the component is coated with a metallization 5.

Such a structure has a limited breakdown voltage. Indeed, the equipotential surfaces tend to curve up to rise to the surface at the periphery of the contact area, which results, especially in the equipotential surface curving areas, in very high field values, which limit the possible reverse breakdown voltage. To enhance device performance, design features called JBS (Junction Biased Schottky) bars and FGR (Floating Guard Rings) were developed, formed by implantation-diffusion at the periphery of the active area of the Schottky diode. However, as discussed above, the formation of a P-type area is not easy by implanting/diffusing in a structure as a silicon carbide substrate because of the requirement of high energy, elevated temperature implantation, and subsequent high temperature annealing for activation. Any such P type region also introduces junction capacitances that will compromise the device's high frequency response.

Therefore, there remains a need for a new and improved fabrication technique especially on the silicon carbide substrate to overcome the problems stated above.

SUMMARY OF THE INVENTION

It is an object of the present invention to provide an innovative design and improved manufacturing process to form a Schottky diode on a silicon carbide (SiC) substrate.

It is another object of the present invention to provide am improved manufacturing process to form a Schottky diode without applying special implantation and high temperature annealing in the process.

The present invention uses metal, which can be easily deposited and patterned, to form Schottky junctions with higher barriers, thus to replace P type region based structures, while achieving substantially similar performance.

In one aspect, a semiconductor device may include a first n-type silicon carbide layer, such as an $N^-$ SiC epitaxial layer, is provided on a second N-type silicon carbide layer, for example, an $N^+$ SiC substrate. In an alternative embodiment, the first N-type silicon carbide layer may be an $N^-$ type SiC substrate and the second n-type silicon carbide layer may be an implanted or epitaxial layer. It is noted that the heavily-doped N-type SiC substrate and the lightly doped N-type epitaxial layer can be integrated to form a desired Schottky threshold.

The semiconductor device may include a first metal layer that is deposited and patterned on the first n-type silicon carbide layer, i.e. the $N^-$ SiC epitaxial layer. In one embodiment, the deposition of the first metal layer can be done by, but not limited to, sputtering, e-beam evaporation, electroplating, etc. In an exemplary embodiment, the first metal layer is a high work function metal layer, which may include, but not limited to, Silver, Aluminum, Chromium, Nickel, Gold, etc.

The semiconductor device may also include a dielectric layer formed on at least a portion of the patterned first metal layer, and a second metal layer deposited and patterned onto at least a portion of the dielectric layer on the first metal layer, and onto the patterned first metal layer that is not covered by the dielectric layer, to form a Schottky diode. The dielectric layer can be used as a passivation layer. In one embodiment, the second metal layer is called a "Schottky metal" layer, which may include, but not limited to, Platinum, Titanium, Nickel Silicide, etc. A junction biased Schottky (JBS) bar can be formed when the Schottky metal layer is in direct contact with the high work function metal.

In another aspect, a method for fabricating a silicon carbide power device may include steps of: forming a first n-type silicon carbide layer on top of a second n-type silicon carbide layer; depositing a first metal layer on the first silicon carbide layer; patterning the first metal layer; depositing and patterning a dielectric layer onto at least a portion of the pattered first metal layer; and depositing and patterning a second metal layer to form a Schottky barrier.

In one embodiment, the first metal layer is a high work function metal layer, which may include, but not limited to, Silver, Aluminum, Chromium, Nickel, Gold, etc. In another embodiment, the second metal layer is called a "Schottky

DETAILED DESCRIPTION OF THE INVENTION

Figure 1:
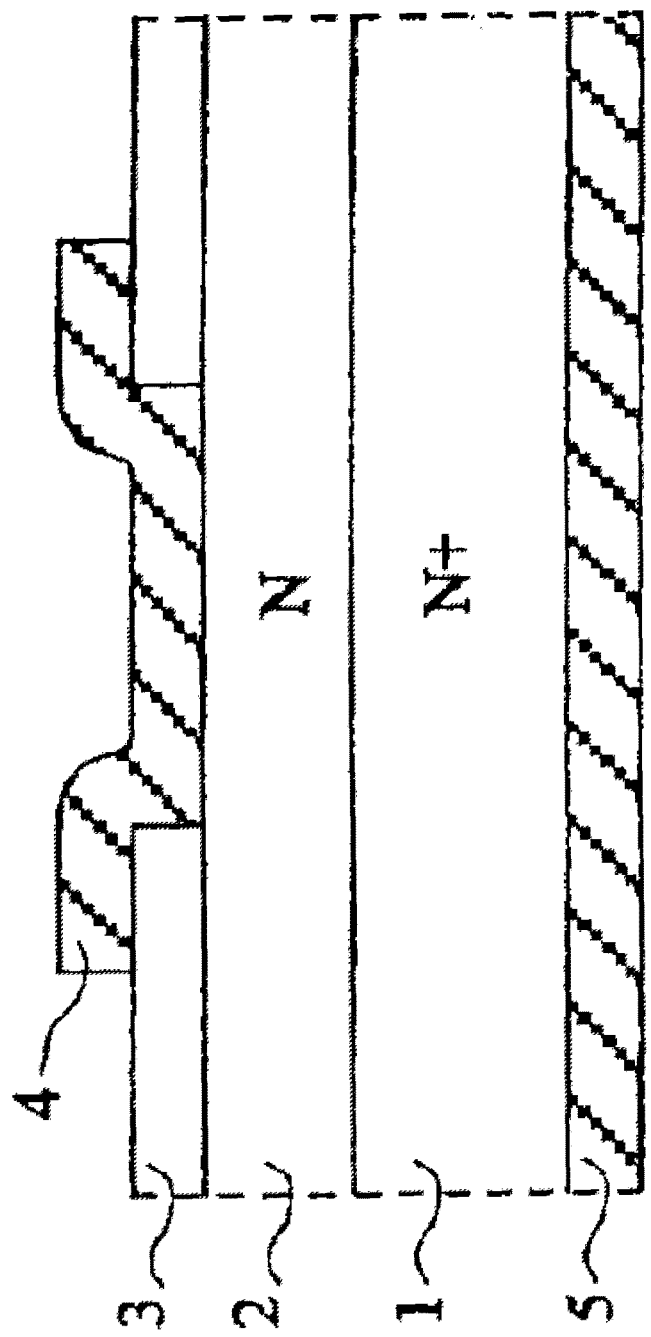
FIG. 1 illustrates a prior art to form a Schottky diode on a silicon carbide (SiC) substrate.
Figure 2:
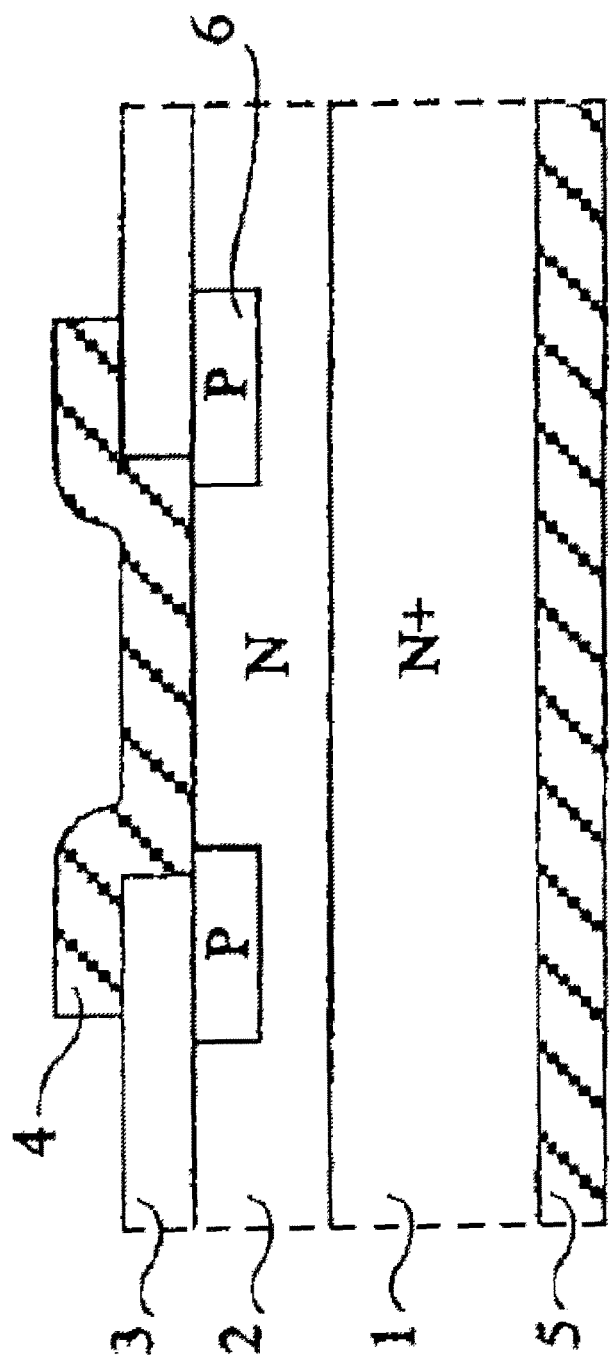
FIG. 2 illustrates another prior art to form a Schottky diode on a silicon carbide (SiC) substrate.

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In order to further understand the goal, characteristics and effect of the present invention, a number of embodiments along with the drawings are illustrated as following:

In one aspect, as shown in FIGS. 3a to 3d, a semiconductor device may include a first n-type silicon carbide layer 320, such as an $N^-$ SiC epitaxial layer, is provided on a second N-type silicon carbide layer 310, for example, an $N^+$ SiC substrate. In an alternative embodiment, the first N-type silicon carbide layer 320 may be an $N^-$ type SiC substrate and the second n-type silicon carbide layer 310 may be an implanted or epitaxial layer. Methods of forming SiC substrates and epitaxial layers are known to those of skill in the art and, therefore, will not be described further herein. It is noted that the heavily-doped N-type SiC substrate 310 and the lightly doped N-type epitaxial layer 320 can be integrated to form a desired Schottky threshold.

The semiconductor device may include a first metal layer 330 that is deposited and patterned on the first n-type silicon carbide layer 320, i.e. the $N^-$ SiC epitaxial layer. In one embodiment, the deposition of the first metal layer 330 can be done by, but not limited to, sputtering, e-beam evaporation, electroplating, etc. In an exemplary embodiment, the first metal layer 330 is a high work function metal layer, which may include, but not limited to, Silver, Aluminum, Chromium, Nickel, Gold, etc.

Figure 3A:
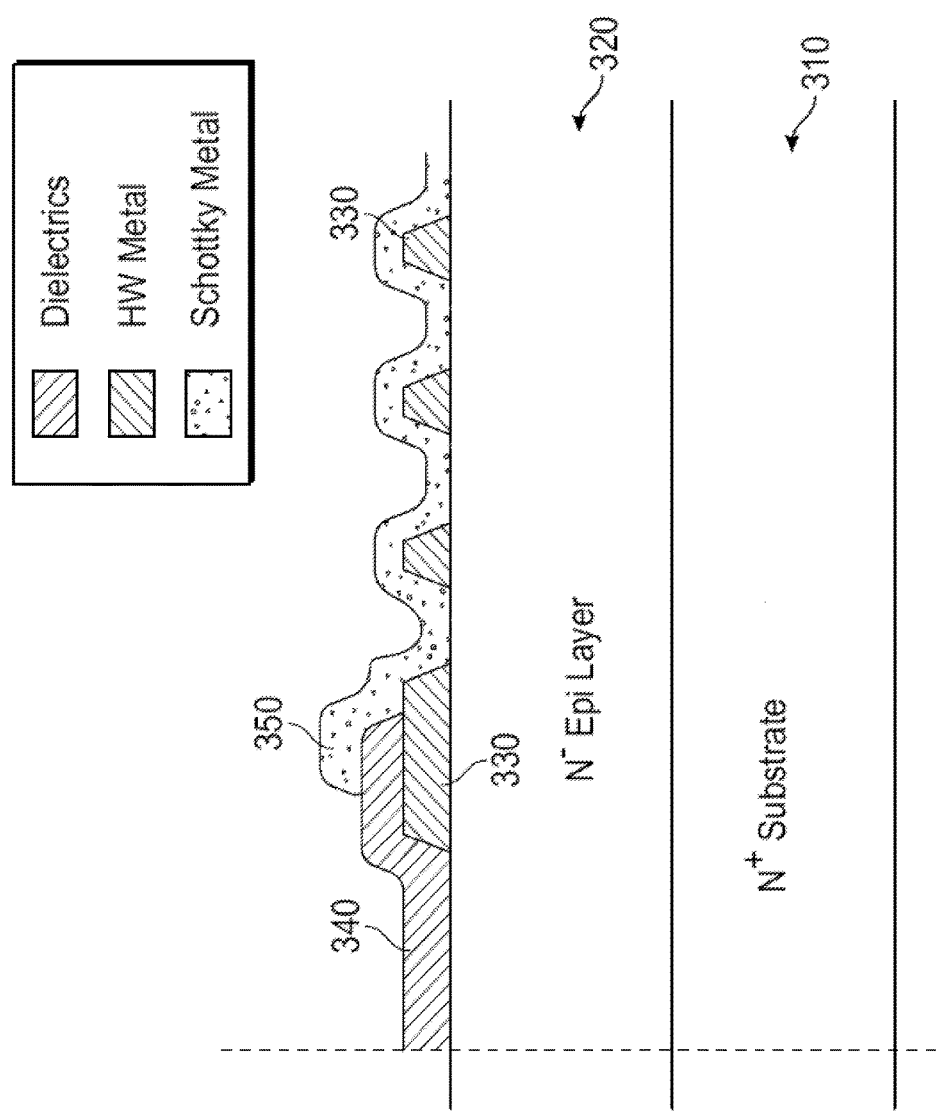
FIG. 3a is a schematic view of the JBS structure without the FGR structures.
Figure 3B:
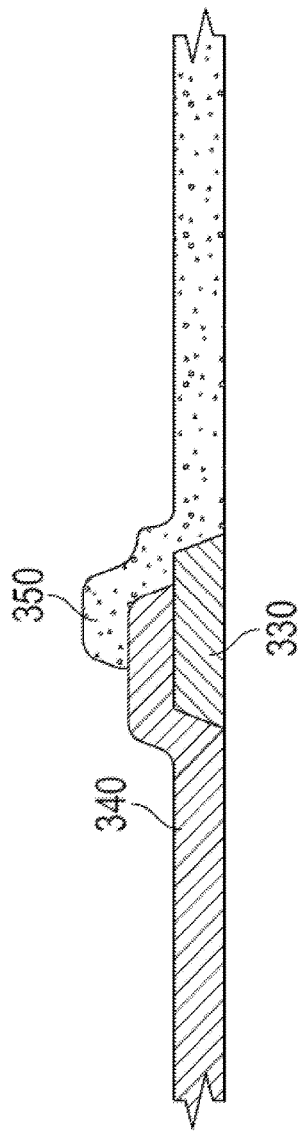
FIG. 3b is a schematic view, in which only edge termination structure is formed without JBS structures.
Figure 3C:
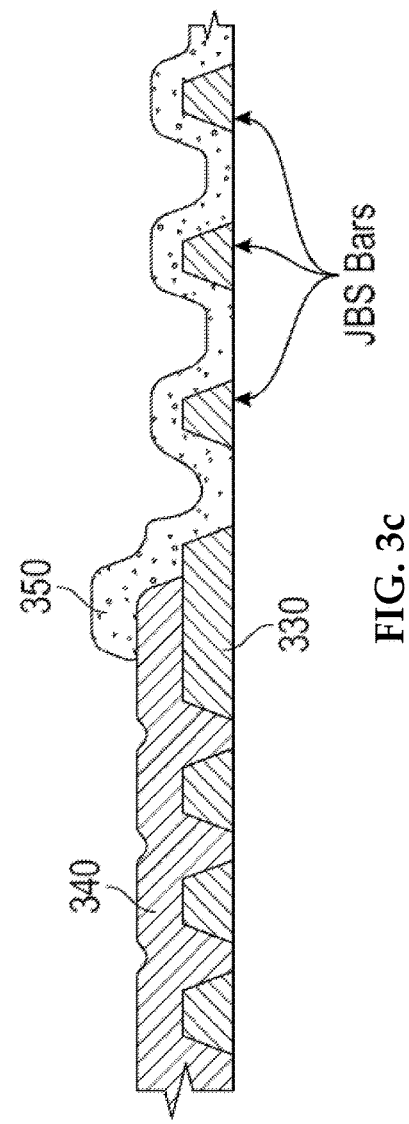
FIG. 3c is a schematic view, in which both FGR and JBS structures are formed together

The semiconductor device may also include a dielectric layer 340 formed on at least a portion of the patterned first metal layer 330, and a second metal layer 350 deposited and patterned onto at least a portion of the dielectric layer 340 on the first metal layer 330, and onto the patterned first metal layer 330 that is not covered by the dielectric layer 340, to form a Schottky diode. The dielectric layer 340 can be used as a passivation layer. In one embodiment, the second metal layer 350 is called a "Schottky metal" layer, which may include, but not limited to, Platinum, Titanium, Nickel Silicide, etc. A junction biased Schottky (JBS) bar can be formed on the right side of the structure as shown in FIGS. 3a and 3c when the Schottky metal layer 350 is in direct contact with the high work function metal 330, while FIG. 3b shows an edge termination structure.

Figure 3D:
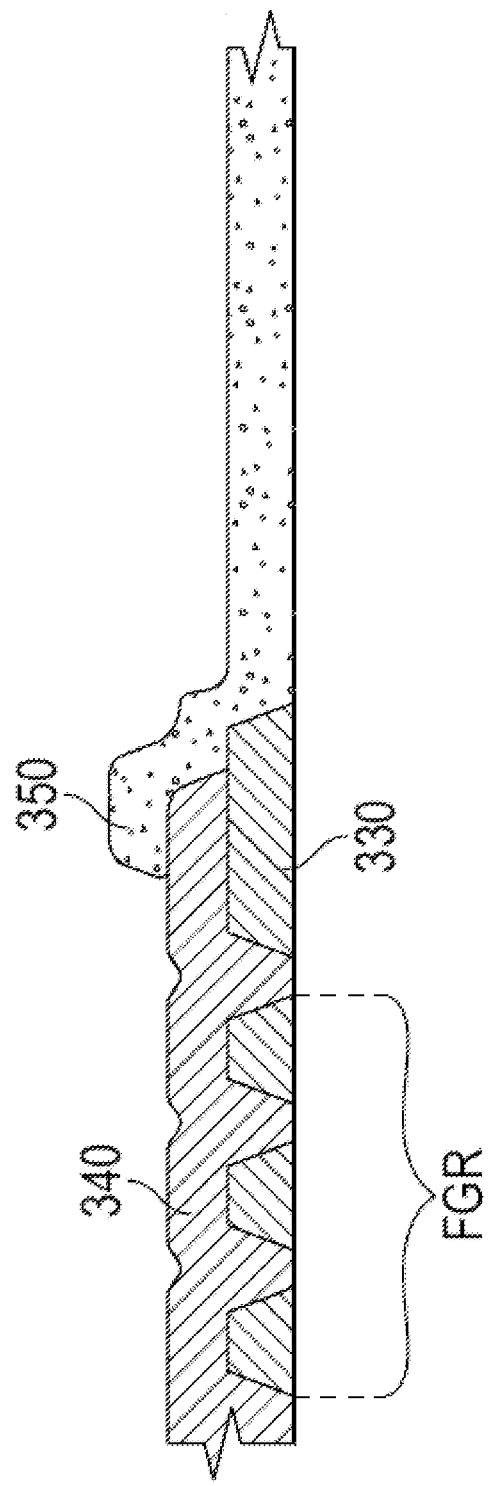
FIG. 3d is a schematic view, in which only FGR is formed.
Figure 4:
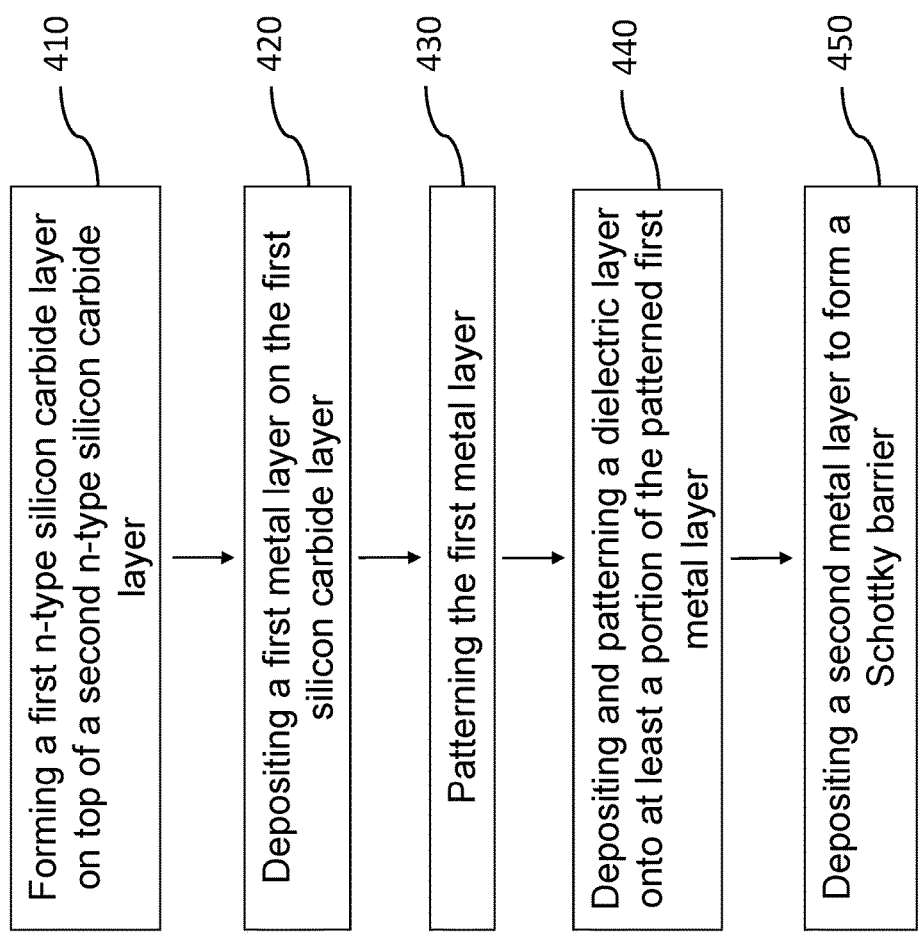
FIG. 4 illustrates a method of manufacturing a Schottky diode on a silicon carbide (SiC) substrate in the present invention.

The term "floating guard ring" (FGR) usually refers to a doped region which has no physical contact or connection with an external current or voltage biased source, and the ring region has no direct contact to a source of electrical potential. In this manner, the FGR can be used to prevent breakdown at the junction edge of the device, thereby enhancing the gain and efficiency of the device. In a further embodiment, the FGR can be formed on the left side of the structure in the present invention as shown in FIGS. 3c and 3d. It is noted that these structures can be used separately or together, depending on the design of the semiconductor device.

In another aspect, a method for fabricating a silicon carbide power device may include steps of: forming a first n-type silicon carbide layer on top of a second n-type silicon carbide layer 410; depositing a first metal layer on the first silicon carbide layer 420; patterning the first metal layer

430; depositing and patterning a dielectric layer onto at least a portion of the pattered first metal layer 440; and depositing and patterning a second metal layer to form a Schottky barrier 450.

In one embodiment, the first metal layer is a high work function metal layer, which may include, but not limited to, Silver, Aluminum, Chromium, Nickel, Gold, etc. In another embodiment, the second metal layer is called a "Schottky metal" layer, which may include, but not limited to, Platinum, Titanium, Nickel Silicide, etc. In a further embodiment, the second metal layer can be deposited onto at least a portion of the dielectric layer on the first metal layer and onto the patterned first metal layer that is not covered by the dielectric layer to form a structure as shown in FIGS. 3a and 3c.

Comparing with conventional techniques, the present invention is advantageous because the manufacturing process of the Schottky diode in the present invention does not need either high voltage or high temperature annealing. Also, the step of implantation/diffusion of the P-type dopant is completely eliminated, so the performance of the Schottky diode can be significantly enhanced while the manufacturing cost can be significantly reduced.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A method for fabricating a silicon carbide power device comprising steps of:
    forming a first n-type silicon carbide layer on top of a second n-type silicon carbide layer;
    depositing a first metal layer on the first silicon carbide layer;
    patterning the first metal layer;
    depositing and patterning a dielectric layer onto at least a portion of the pattered first metal layer; and
    depositing and patterning a second metal layer to form a Schottky barrier without forming any p-type region on said power device.

2. The method for fabricating a silicon carbide power device of claim 1, wherein the first n-type silicon carbide layer is a lightly-doped $N^-$ silicon carbide epitaxial layer, and the second n-type silicon carbide layer is a heavily-doped $N^+$ silicon carbide substrate.

3. The method for fabricating a silicon carbide power device of claim 1, wherein the first metal layer is deposited on the first silicon carbide layer by sputtering, e-beam evaporation, electroplating or the like.

4. The method for fabricating a silicon carbide power device of claim 1, wherein the first metal layer is a high work function metal layer, including Silver, Aluminum, Chromium, Nickel and Gold.

5. The method for fabricating a silicon carbide power device of claim 1, wherein the step of depositing and patterning a second metal layer to form a Schottky barrier includes a step of depositing and pattering the second metal layer onto at least a portion of the dielectric layer on the first metal layer, and onto the patterned first metal layer that is not covered by the dielectric layer.

6. The method for fabricating a silicon carbide power device of claim 1, wherein the second metal layer includes Platinum, Titanium and Nickel Silicide.

7. The method for fabricating a silicon carbide power device of claim 1, wherein a junction biased Schottky (JBS) bar is formed when the second metal layer is in direct contact with the first metal layer.

* * * * *